United States Patent [19]

Brown

[11] 4,063,179
[45] Dec. 13, 1977

[54] CHANNEL SELECTOR FOR A SCANNING MONITOR RECEIVER

[75] Inventor: Marshall M. Brown, San Marino, Calif.

[73] Assignee: Craig Corporation, San Marino, Calif.

[21] Appl. No.: 707,387

[22] Filed: July 21, 1976

[51] Int. Cl.² .......................................... H04B 1/32
[52] U.S. Cl. ................................. 325/470; 325/464; 325/465; 325/335; 325/456
[58] Field of Search ............... 325/452, 455, 456, 457, 325/334, 335, 469, 464, 470, 453, 465

[56] References Cited

U.S. PATENT DOCUMENTS

| | | | |
|---|---|---|---|
| 2,832,889 | 4/1958 | Kearney | 325/470 |
| 3,470,481 | 9/1969 | Myers | 325/470 |
| 3,497,813 | 2/1970 | Gallagher | 325/470 |
| 3,602,822 | 8/1971 | Evans | 325/470 |
| 3,821,651 | 6/1974 | Fathauer et al. | 325/470 |
| 3,839,681 | 10/1974 | Mogi | 325/464 |
| 3,845,394 | 10/1974 | Hamada | 325/470 |
| 4,000,470 | 12/1976 | Okada | 325/470 |

Primary Examiner—Benedict V. Safourek
Assistant Examiner—Tommy P. Chin
Attorney, Agent, or Firm—Schuyler, Birch, Swindler, McKie & Beckett

[57] ABSTRACT

A radio broadcast receiver is disclosed for sequentially scanning and monitoring a plurality of preselected broadcast channels to determine the presence of a radio signal in any one of the preselected broadcast channels. Selector means are provided for each preselected channel to enable the user to individually select the mode of operation for each preselected channel. Three modes of operation are provided for each channel as follows: (1) the scan mode; (2) the bypass mode; and (3) the select mode. Structurally, the receiver comprises a two pole, three-position switch associated with each channel. With the switches in their "scan" position, the receiver automatically scans each channel in sequence, stopping only on a channel which is broadcasting, and resumes scanning when such station terminates broadcasting. If any switch is moved to a second "bypass" position, the scanning proceeds as above but without stopping on the bypassed channel. The third position, called the "select" position, permits selection of a subgroup of one or more channels to be scanned. A principal advantage of this arrangement is that automatic scanning can be provided between any selected channels by a positive selection process. The user need not work backward to achieve the same result, that is, by bypassing all channels he wished not to scan. In addition, this radio receiver includes a scanning speed control circuit for adjusting the speed of the scanner according to the mode of operation of each channel. Thus, when a preselected channel is encountered with its selector switch positioned in an unused mode, that is either the bypass mode or the non-select mode when another switch is in the select mode, the speed of the scanning is increased to effectively eliminate the scanning period.

10 Claims, 2 Drawing Figures

CHANNEL SELECTOR FOR A SCANNING MONITOR RECEIVER

BACKGROUND OF THE INVENTION

This invention relates generally to a radio broadcast receiver, and more particularly is directed to an improved scanning monitor receiver for scanning a plurality of preselected broadcast channels.

Radio braodcast receivers for monitoring a plurality of preselected broadcast channels are presently in wide use. These radio receivers are customarily used to monitor public safety two-way radio communication channels in one or more of the following three different bands of frequencies assigned by the Federal Communications Commission: the low VHF band from 30 to 50 MHZ; the high VHF bands from 150 to 174 MHZ; and the UHF band from 450 to 520 MHZ. Both public and private agencies, such as police, ambulance, fire, lifeguard, Red Cross and Forest Service are assigned specific frequencies within these bands.

Monitor scanning receivers presently in use customarily provide automatic scanners for selectively tuning the receiver to the preselected channels. For example, individual tuning circuits might be provided for each preselected broadcast channel. These tuning circuits then are sequentially scanned by the automatic scanner. If one of the preselected broadcast channels is active, that is, a radio signal is received, the automatic scanner stops the sequential scanning process and locks onto the active preselected channel. The automatic scanner remains locked on this active channel for the length of the transmission, even though one or more of the other preselected broadcast channels might subsequently become active. At the end of the transmission, the automatic scanner reocmmences the scanning process and searches for other active preselected channels.

The scanning monitor receivers of the prior art typically are respesented by U.S. Pat. No. 2,739,232 issued to Schwartz on Mar. 20, 1956, U.S. Pat. No. 2,832,889 issued to Kearney on Apr. 29, 1958, and U.S. Pat. No. 2,825,804 issued to Rug on Mar. 4, 1958. These patents show radio receivers which scan a plurality of favorite stations in order to determine whether a radio signal of sufficient strength is present on any one of the favorite stations. If a radio signal of sufficient strength is present, the scanning process is stopped at the appropriate favorite station. While these patents show different methods of station selection, Rug shows a method for scanning only the favorite stations by sequentially scanning a plurality of tuned circuits. However, none of these prior art radio receivers provide the user with the convenient capability of varying the scanning program, that is, the capability of either selecting one or more of the designated favorite stations for scanning or bypassing one or more of the designated favorite stations during scanning.

Some of the radio receivers in the prior art provide the user with the capability of varying the scanning program. For example, U.S. Pat. No. 3,470,481 issued to Meyers on Sept. 30, 1969, shows a scanning monitor receiver for two preselected broadcast channels which also contains an override switch for stopping the sequential scanning process on the selected channel. However, this override switch provides the user with a very limited capability of varying the scanning program.

A much more refined and complicated system for varying the scanning program for a plurality of radio broadcast channels is shown in U.S. Pat. No. 3,845,394 issued to Hamada on Oct. 29, 1974. Hamada discloses an elaborate signal-seeking FM receiver having a pair of memory banks, one of which stores the frequency of all stations receivable in the immediate area, and a second which may be used to store just those stations of immediate interest. Stations for the first memory are determined by scanning the entire radio broadcast band to determine those radio stations with a sufficiently strong radio signal. To select stations for the second memory, stations from the first memory are transferred into the second memory and those which are not desired in the second memory are then removed. Additional stations may also be added to the second memory by means of a relatively complex method. Thus, the second memory embodiment of Hamada does show a method for selecting a subgroup of one or more channels from a larger group of preselected channels. This subgroup may be scanned in the repeat mode by enabling the listener to monitor the contents of the programs broadcast by the several stations. However, this scanning process does not automatically stop on active broadcast channels. The only method of channel selection is manual activation of one of numerous switches provided for this purpose. In addition, Hamada does not show a convenient and simple method for bypassing certain broadcast channels contained in either memory during the scanning process. Therefore, although Hamada does show a fairly comprehensive programming technique for an automatic scanner, the user is unable to easily and instantly reprogram.

Channel selecting devices for televisions also employ mechanisms for bypassing unused television channels and/or preselecting television channels for automatic scanning. For example, U.S. Pat. No. 3,839,681 issued to Mogi on Oct. 1, 1974, shows a system for automatically skipping unused channels and/or preselecting channels to be automatically scanned. Similarly, U.S. Pat. No. 3,602,822 issued to Evans on Aug. 31, 1971, shows a television programmer with an automatic scanning feature for scanning a preselected number of television channels. However, these television scanning systems do not show an automatic scanner which stops scanning in response to the the presence of a signal in the preselected channels. The stopping feature of these television scanners is controlled by the selected program rather than by the presence of a television signal in any preselected television channel. Thus, not only do the above patents not show a combination of a bypass and select mode, but they also fail to disclose an automatic scanner capable of skipping a preselected channel in the absence of an incoming television signal.

It is therefore, an object of this invention to provide a scanning monitor receiver with a scanning selector switch which enables the user to more conveniently control the operation of each preselected broadcast channel. More specifically, it is an object of this invention to enable the user to select one of three possible modes of operation for each preselected broadcast channel: (1) a select mode for scanning a subgroup of one or more preselected channels which does not require the user to set the undesired channels to the bypass mode in order to automatically scan only the desired preselected channels; (2) a scan mode for automatically scanning all preselected broadcast channels; and (3) a bypass mode for bypassing certain preselected broadcast channels to eliminate reception on these bypassed channels.

It is a further object of this invention to provide a selector switch for a scanning monitor receiver which reduces the number of operations required to change the operating mode of the scanner while at the same time providing a more direct approach for selecting a subgroup of one or more preselected broadcast channels and/or bypassing one or more preselected broadcast channels.

SUMMARY OF THE INVENTION

This invention is a radio broadcast receiver for scanning and monitoring a plurality of preselected broadcast channels to determine whether a radio signal is present in any of the preselected broadcast channels. The presence of a radio signal in any one of the preselected broadcast channels causes the receiver to stop scanning and lock on the preselected channel wherein the radio signal is received. The radio receiver contained herein incorporates a plurality of two pole, three-position selector switches, one for each preselected channel for enabling the user to select one of three possible modes of operation. In the scan position, the selector switch enables the radio receiver to normally scan all the preselected broadcast channels to determine the presence of a radio signal. By using the select position, the user may select a subgroup of one or more of the total number of preselected channels to be scanned. The radio receiver will then automatically scan and monitor any channel or group of channels placed in the select position. This select position obviates the manual mode of conventional scanners that necessitates stepping through each channel one at a time until the desired station is reached. The final position is the bypass position which enables the user to bypass certain channels so that the radio receiver will scan and monitor all remaining preselected broadcast channels. A select gate is provided in each channel which is responsive to the position of the two pole, three-position selector switch for controlling the automatic scanner and selectively activating each of a plurality of tuning circuits, one for each channel, in the radio receiver. The invention further provides a scanning speed control circuit which enables the automatic scanner to effectively eliminate the scanning period of preselected broadcast channels positioned in either the bypass mode or the scan mode at the same time one or more other channels are positioned in the select mode. Reset means are also provided to actuate the automatic scanner when a subgroup of one or more of the preselected broadcast channels is positioned in the select mode. This reset means enables the automatic scanner to locate immediately the preselected broadcast channels positioned in the select mode regardless whether another preselected channel is presently monitoring a radio broadcast signal.

DETAILED DESCRIPTION OF THE DRAWINGS

Figure 1:
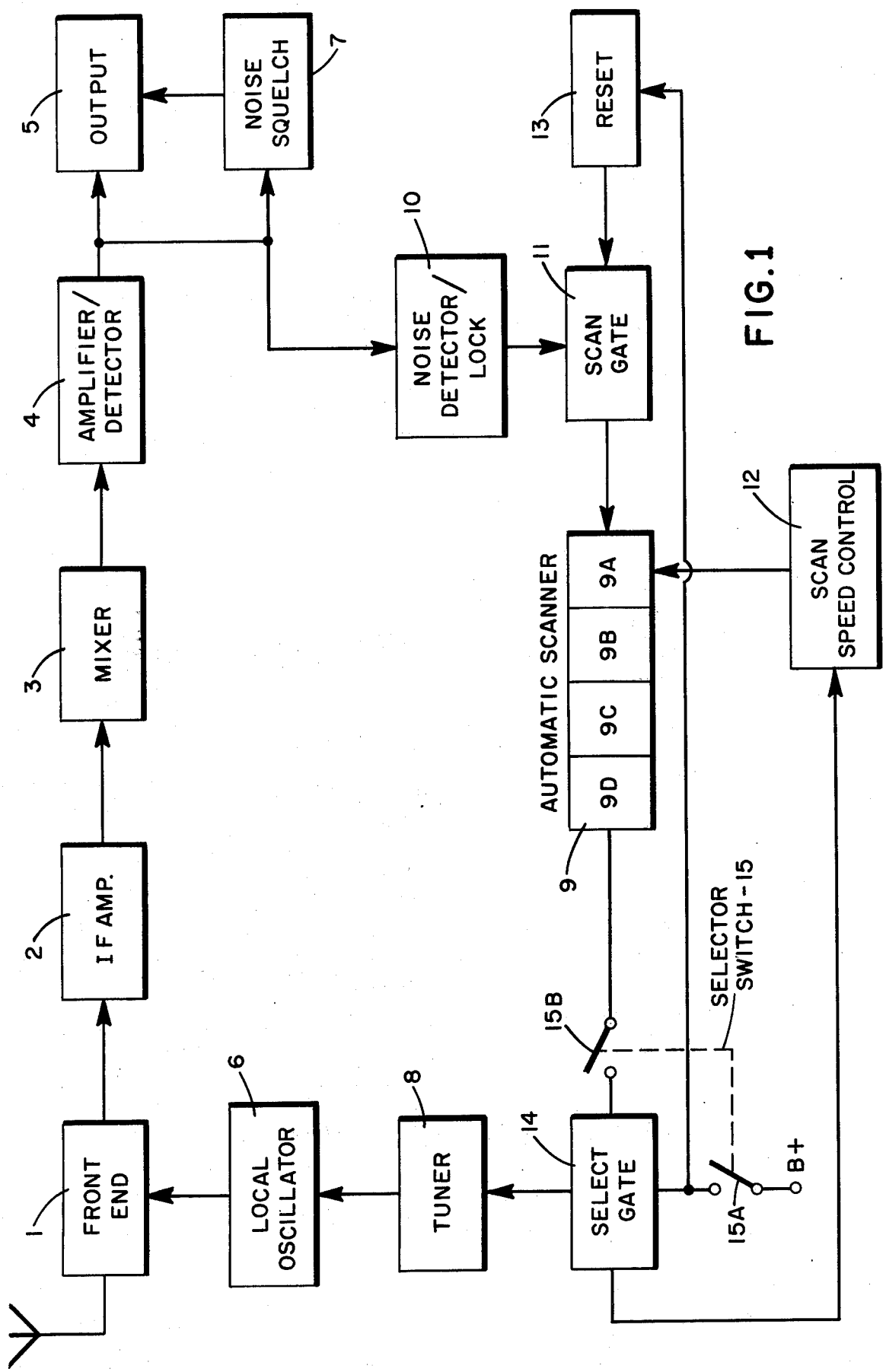
FIG. 1 is a block diagram showing the radio broadcast receiver according to the present invention including the automatic scanner and the two pole, three-position selector switch for selecting either the select, scan or bypass mode.

The system shown in FIG. 1 illustrates the preferred embodiment of the mode selection and scanner of the invention for use with a known radio receiver. In such a receiver, radio waves broadcast from a number of stations are received by an antenna which supplies radio signals to front end 1 comprising an RF amplifier and mixer. A local oscillator 6 is connected to the front end 1 for tuning the front end 1 to receive a plurality of preselected radio broadcast channels. To the front end 1 are connected in order, an intermediate frequency amplifier 2, a mixer 3, an amplifier/detector 4, a noise squelch circuit 7, and an output circuit for converting the radio broadcast signals to an audio signal. The operation of these elements is well known in the prior art.

The local oscillator 6 provides a plurality of oscillating frequencies to the front end 1 in order to enable the radio receiver to receive a plurality of preselected broadcast channels. The oscillating frequency of the local oscillator 6 is controlled by the tuner 8. This tuner 8 comprises a plurality of separate tuned circuits each with a preselected tune frequency. As these separate tune circuits are individually connected to the local oscillator 6, the radio receiver is enabled to receive a plurality of preselected broadcast channels. These channels are preselected by setting the tuning frequency of the tuning circuits in tuner 8.

The automatic scanner of the preferred embodiment comprises in combination a scanning oscillator 9A which supplies a pulse to pulse control circuit 9B for stepping the BCD counter 9C at a periodic rate. The BCD counter 9C counts the number of pulses and supplies an input to a decimal decoder 9D in a manner well known in the art. The decimal decoder 9D provides a plurality of outputs in a sequential order. These sequential outputs are used to actuate the tuned circuits of the tuner 8. Thus, the mode selector and scanner of this invention enables the radio receiver to receive a plurality of preselected broadcast channels by sequentially connecting a plurality of tuning circuits in tuner 8 to the local oscillator 6.

In addition to scanning a plurality of preselected broadcast channels, the scanning monitor receiver disclosed herein is designated to stop scanning and lock on to an active, preselected broadcast channel, that is, a channel on which a radio signal is present. This is accomplished through the noise detector/locking means 10 which is sensitive to atmospheric noise in the radio receiver. The noise detector/locking means 10 is connected to the amplifier/detector 4 of the radio receiver. The absence of atmospheric noise in the amplifier/detector 4 resulting from the presence of a radio signal carrier causes the noise detector/locking means 10 to actuate the scan gate 11 which stops the scan oscillator 9A. Upon termination of the transmission of this radio signal, the noise detector/locking means 10 again is subjected to atmospheric noise. This reactivates the scan oscillator 9A and sequential scanning of the preselected broadcast channels recommences.

The automatic scanner 9 of the present invention is connected to the tuner 8 by the select gate 14 and the selector switch 15. The selector switch 11 comprises a first pole 15A connected to a first input of the select gate 14 and a second pole 15B connected between the automatic scanner 9 and the select gate 14. Selector switch 15A provides a first control input from a voltage source to the select gate 14 and selector switch 15B provides a second control input from the automatic scanner 9 to the select gate 14. Three different combinations of the first control input and the second control input of the select gate 14 enables the select gate 14 to function in the following three modes of operation: (1) a scan mode which enables the select gate 14 to sequentially actuate each of the tuning circuits of tuner 8 so that the receiver automatically searches for a radio signal in the preselected broadcast channels; (2) a bypass mode which enables the select gate 14 to bypass certain tuning circuits of tuner 8 so that reception is eliminated on the bypassed preselected broadcast channels; and (3) a select mode which enables the scan gate 11 to actuate a subgroup of one or more tuning circuits of tuner 8 so that the receiver automatically searches for a radio signal in the subgroup of preselected channels in the select mode.

According to the present invention shown in FIG. 1, the select gate 14 comprises a plurality of select gates, one for each channel, and the selector switch 15 comprises a plurality of selector switches, one for each channel. These select gates and selector switches are interconnected in such a manner that, when one or more selector switches are positioned in the select mode for selection of one or more preselected channels, the other remaining preselected channels are inhibited by their respective select gates from receiving a radio signal. Thus, the user of the radio receiver disclosed in the preferred embodiment is able to select a subgroup of one or more channels for automatic scanning while simultaneously preventing reception on other channels. A principal advantage of this arrangement is that the scanning mode can be chosen by a positive selection process. It is not necessary for the user to move the selector switches 15 associated with undesired channels to the bypass mode in order to scan only the desired subgroup of one or more preselected broadcast channels.

The block diagram in FIG. 1 further shows a scanning speed control circuit 12 connected to the scan oscillator 9A for adjusting the speed of the scan oscillator in response to the condition of the select gate 14. The scanning speed control circuit 12 increases the speed of the scan oscillator 9A whenever a preselected broadcast channel is encountered by the automatic scanner 9 which is either in the bypass mode or in the scan mode at the same time another channel is in the select mode. Thus, the scanning period of unused preselected channels is significantly reduced. FIG. 1 also shows a reset 13 which resets the automatic scanner 9 when one or more of the selector 15 is positioned in the select mode. This enables the automatic scanner 9 to recommence scanning immediately after any selector switch 15 is positioned in the select mode.

Figure 2:
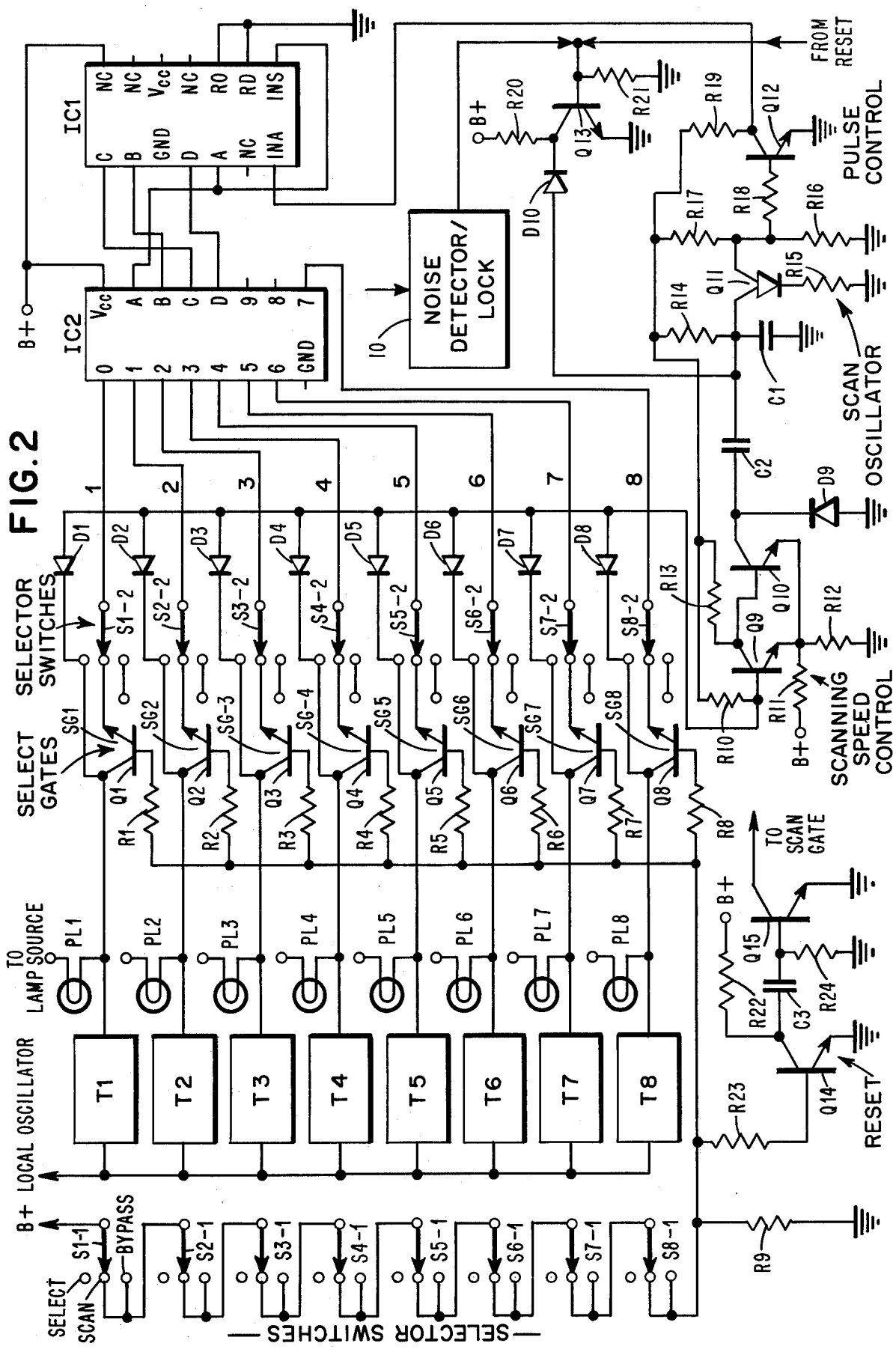
FIG. 2 s a circuit diagram showing the automatic scanner, the scanning speed control circuit and the plurality of the tuning circuits, the selector switches and select gates.

The detailed operation of the radio broadcast receiver of the present invention is best understood by referring to FIG. 2 which shows a detailed circuit diagram of the automatic scanner 9, the plurality of select gates 14, the selector switches S1-S8, and the plurality of tuning circuits T1-T8.

The scanning operation of the scanning monitoring receiver of the present invention is established by the positioning of the selector switches S1-S8. These selector switches are two pole, three-position switches. The first poles are shown in FIG. 2 by selector switches S1-1 through S8-1 while the second poles are shown in FIG. 2 by the switches S1-2 through S8-2. Associated with each pole in FIG. 2 are three separate contact positions. The top contact position is the select mode, the middle contact position is the scan mode and the bottom contact position is the bypass mode. The first poles of the selector switches S1-1 through S8-1 are connected in a chain fashion to a positive voltage source B+. The chain circuit comprises a connection of the second and third contact positions of each selector switch to the pole of the adjacent selector switch. In this manner, the first poles of the selector switches S1-1 through S8-1 are connected to each other through the second and third contact positions of adjacent selector switches. This chain circuit comprising the first poles of the selector switches S1-1 through S8-1 is connected to ground through a biasing resistor R9 and to the first inputs of the select gates SG1-SG8. The second poles of the selector switches S1-2 through S8-2 are connected to the second inputs of the select gate means S1-SG8.

The selector switches S1-S8 shown in FIG. 2 are positioned in the scanning mode. In this position, the voltage source B+ connected to the chain circuit is connected to ground through R9. The voltage across R9 is used to forward bias the bases of select gate transistors Q1-Q8 through resistors R1-R8. These select gate transistors Q1-Q8 are sequentially scanned by the decimal decoder IC2 of the automatic scanner 9 which sequentially applies a ground potential to the second contact position of the second pole of the selector switches S1-2 through S8-2. When this ground potential is sequentially connected to the emitter of each of the select gate transistors Q1-Q8, each transistor is turned on resulting in a low voltage at the collector of the transistor. As each collector receives this low voltage, the tuner circuits T1-T8 associated with each select gate transistor Q1-Q8 are sequentially actuated and the local oscillator receives the tuning frequency. At the same time, the pilot lights PL1-PL8 are sequentially turned on to indicate which preselected channel is actuated.

For example, consider select gate transistor Q1 and the selector switch S1 connected to tuning circuit T1. Assume that the output of the decimal decoder IC2 associated with selector switch S1 is low (0 volts). At the same time, all other outputs of the decimal decoder IC2 are high. Thus, with the selector switch S1 in the scan position, the base of select gate transistor Q1 is forward biased and the emitter is low (0 volts). Select gate transistor Q1 then conducts and its collector drops to a low voltage. Pilot light PL1 and tuning circuit T1 are actuated and the radio receiver is enabled to receive radio signals on the preselected broadcast channel associated with tuning circuit T1.

The low voltage impressed on the collector of select gate transistor Q1 when the transistor is turned on is also used to control the operation of the scanning speed control circuit. Switching diodes D1-D8 connect the collectors of the select gate transistors Q1-Q8 to the scanning speed control circuit. Although the operation of the scanning speed control circuit will be described below in greater detail, for the above example, when the switching diode D1 senses a low voltage on the collector of select gate transistor Q1, the scanning speed control circuit is switched to low speed and the scanning rate is slowed down to approximately 16 channels per second.

The automatic scanner 9 of the present invention is shown in detail in FIG. 2. The scan oscillator first provides pulses to the BCD counter IC1 which then provides signals to the decimal decoder IC2; the decimal decoder IC2 then sequentially steps a low voltage signal through each of its outputs connected to the preselected broadcast channels. The scan oscillator comprises a programmable unijunction transistor Q11 connected to timing capacitor C1 and biasing resistors R14–R17. The output of the unijunction transistor Q11 is connected to pulse control transistor Q12 which supplies the trigger pulse to the BCD counter IC1 at the approximate rate of once every 1/16 of a second. The pulse control transistor Q12 is biased by resistors R16–R19.

In the normal scan mode, the scan oscillator will continue to trigger the BCD counter IC1 and the decimal decoder IC2 until a radio signal is received in one of the preselected broadcast channels. As described previously with respect to FIG. 1, in the absence of atmospheric noise caused by the receipt of a radio carrier, the noise detector/locking means 10 actuates the scan gate transistor Q13 to inhibit the operation of the scan oscillator. The scan gate transistor Q13 is biased by biasing resistors R20 and R21. When scan gate transistor Q13 is turned on in response to the receipt of a radio signal in one of the preselected broadcast channels, the timing capacitor C1 of the scan oscillator is bypassed by a circuit comprising the scan gate transistor Q13 and diode D10. Thus, the scan oscillator is no longer able to generate trigger pulses to the BCD counter IC1. Upon termination of the transmission of the radio signal on a preselected broadcast channel, atmospheric noise is again detected by detector/locking means 10 which turns off scan gate 11 and allows the scan oscillator to again supply trigger pulses to the BCD counter IC1.

One or more of the selector switches S1–S8 may be positioned in the bypass mode, that is the lower position of the three positions shown in FIG. 2. With one or more of the selector switches S1–S8 positioned in the bypass mode and all the remaining selector switches positioned in the scan mode, the chain circuit connecting the first poles of the selector switches S1-1 through S8-1 remains in a closed circuit and a forward bias is applied to the select gate transistors Q1–Q8. In the bypass mode, although all the first inputs of the select gate means SG1–SG8 remain actuated, the second inputs of the particular select gate means associated with the selector switches positioned in the bypass mode are in an open circuit. Thus, the particular select gate transistors connected in the bypass mode are turned off and their associated tuning circuits are not actuated.

For example, if selector switch S2 is positioned in the lower or bypass mode, the select gate transistor Q2 is turned off because its emitter is connected to an open circuit. Thus, the collector of select gate transistor Q2 remains at a sufficiently high voltage to prevent the actuation of tuning circuit T2. However, the emitters of the remaining select gate transistors Q1, Q3–Q8 will be connected to the decimal decoder through the second pole of selector switches S1-2, S3-2 through S8-2 and the bases will be forward biased through the chain circuit. As a result, the select gate transistors Q1, Q3–Q8 will conduct in a sequential manner when decimal decoder IC2 supplies a low (0 volts) to the emitters of each of the select gate transistors Q1, Q3–Q8. In this manner, one or more of the preselected broadcast channels may be placed in the bypass mode while the remaining preselected broadcast channels may be sequentially scanned by the automatic scanner 9.

In the above example, the scanning speed control circuit will transfer to high speed when the automatic scanner 9 reaches select gate transistor Q2. This is because the select gate transistor Q2 is turned off and its collector remains at a high voltage potential. Thus, not only is the tuning circuit T2 not actuated when selector switch S2 is positioned in the bypass mode, but also the scanning speed control circuit runs at high speed.

The scanning speed control circuit comprises transistors Q9 and Q10, biasing resistors R10–R13, diode D9 and coupling capacitor C2. During the normal scanning operation, the low voltage impressed on the collector of each of the select gate transistors Q1–Q8 during sequential scanning turns off transistor Q9. Transistor Q9 then turns on transistor Q10 which is connected to the programable unijunction transistor Q11 through coupling capacitor C2. With transistors Q9 and Q10 in this state, the scan oscillator triggers the BCD counter IC1 approximately every 1/16 of a second. However, when one or more of the select gate transistors Q1–Q8 is turned off, as in the bypass mode of the above example, transistor Q9 of the scanning speed control circuit is turned on and transistor Q10 is turned off. The resulting voltage on the input of the programable unijunction transistor Q11 causes the scan oscillator to trigger in less than 100 microseconds. This is approximately 1000 times faster than the programable unijunction transistor Q11 triggers when transistor Q10 is turned on. Thus, the scanning speed control circuit effectively eliminates the scanning period when the scanning mechanism encounters a preselected broadcast channel with a selector switch S1–S8 positioned in the bypass mode.

The three-position selector switches S1–S8 may also be positioned in the select mode which is the uppermost position shown in FIG. 2. With any one of the selector switches S1–S8 positioned in this manner, the chain circuit formed by the first poles of the selector switches S1-1 through S8-1 forms an open circuit and no forward bias is applied to the bases of any of the select gate transistors Q1–Q8. All the select gate transistors Q1–Q8 are turned off. However, the select gate means SG1–SG8 also include a shunt circuit shown in FIG. 2 connected between the select position of the second poles of the selector switches S1-2 through S8-2 and the collector output of the select gate transistors Q1–Q8. For those channels positioned in the select mode, this shunt circuit provides a direct connection between the decimal decoder IC2 and the selected tuning circuits. The low voltage (0 volts) applied directly by the decimal decoder IC2 to the tuning circuit actuates the preselected channel of the selected tuning circuit.

For example, assuming the three-position selector switches S3 and S4 are positioned in the select mode and the remaining selector switches are positioned in either the scan mode or the bypass mode, the select gate transistors Q1, Q2, Q5–Q8 are turned off and the shunt circuit associated with select gate means SG1, SG2, SG5–SG8 are not connected directly to the decimal decoder IC2. The collectors of select gate transistors Q1, Q2, Q5–Q8 remain in the high voltage state during the sequential scanning process causing the scanning speed control means to run at high speed in order to effectively eliminate the scanning period associated with these channels. However, the shunt circuits associated with select gate means SG3 and SG4 directly connect the decimal decoder IC2 to tuning circuits T3 and T4 through the second pole of the selector switches S1-2 through S8-2. When the decimal decoder IC2 applies a low (0 volts) to each of these shunt circuits, the tuning circuits T3 and T4 are actuated. The user is thus able to conveniently select a subgroup of one or more of the preselected broadcast channels for sequential scanning without the necessity of switching all the remaining undesired preselected broadcast channels to the bypass mode. For instance, in the example above, prior art systems require the user to switch selector switches S1, S2, S5–S8 to the bypass mode in order to achieve the same result. The present system allows the user to make a positive selection of the desired preselected broadcast channels.

The system of the present invention also contains a reset circuit which is actuated when any of the selector switches S1–S8 is positioned in the select mode. This is accomplished by connecting the chain circuit directly to the reset circuit comprising transistors Q14 and Q15, biasing resistors R22–R24, and coupling capacitor C3. If any one of these selector switches S1–S8 is positioned in the select mode at any time, including during the receipt of a radio signal in one of the channels, the reset circuit triggers the scan gate transistor Q13 and the scan oscillator which advances the BCD counter IC1 and the decimal decoder IC2. For example, the positioning of selector switches S3 and S4 in the select mode in the above example results in a momentary pulse from the reset circuit which actuates scan gate transistor Q13. The scan oscillator is then triggered and the automatic scanner 9 commences sequential scanning of the channels positioned in the select mode.

Although illustrative embodiments of the invention have been described in detail with reference to the accompanying drawings, it is to be understood that the invention is not limited to those precise embodiments and that various changes and modifications may be effected therein by one skilled in the art without departing from the scope or spirit of the invention. For example, it is to be understood that the invention is not limited to a radio receiver with eight preselected broadcast channels. Any number of preselected broadcast channels may be selected for use in this invention. In addition, the scanning monitor receiver of this invention may be fully programmed in an endless combination of VHF and UHF frequencies. It may also be adapted for mobile mounting in car, truck, or boat, in addition to base station operation at home or business.

I claim:

1. In a radio broadcast receiver for automatically monitoring a plurality of preselected broadcast channels, said receiver comprising a plurality of tuning means for enabling said receiver to receive a preselected plurality of broadcast channels, scanning means connected to said tuning means for sequentially scanning said plurality of tuning means to determine whether a ratio signal is present in any of said plurality of preselected channels, locking means connected to said scanning means for stopping the sequential scanning, said locking means being responsive to the presence of a radio signal in a particular preselected channel for locking said scanning means on said particular preselected channel for the length of transmission, said scanning means automatically recommencing sequential scanning upon termination of said transmission, the improvement comprising:

a plurality of select gate means connected between said scanning means and each of said plurality of tuning means for controlling the activation of each of said tuning means in response to the sequential scanning of said scanning means; and a plurality of three-position switches, one of which is connected to each of said select gate means in each of the preselected broadcast channels, whereby the operation of each of said select gate means is controlled by the position of the three-position switch connected thereto, said switches being positionable to select one of the following three modes of operation for said select gate means with respect to each of said preselected channels:

a. a select mode wherein a subgroup of one or more of the preselected channels is selected for scanning, said select mode being represented by a first contact position in each of said switches;

b. a normal scan mode wherein all the preselected channels are scanned, said scan mode being represented by a second contact position in each of said switches; and c. a bypass mode wherein a subgroup of one or more of the preselected channels may be bypassed during sequential scanning, said bypass mode being represented by a third contact position in each of said switches.

2. A radio broadcast receiver according to claim 1 in which said plurality of three-position switches comprise first poles and second poles, said first poles being connected to first inputs of said plurality of select gate means when said switches are in said second or third position, and said second poles being connected between second inputs of said plurality of select gate means and said scanning means when said switches are in said first or second contact positions, whereby the operation of said select gate means is controlled by the position of said switches.

3. A radio receiver according to claim 2 in which said first inputs of said plurality of select gate means are connectable to a voltage source through a chain circuit, said chain circuit comprising a series connection of said first poles in a closed circuit when all said plurality of three-position switches are positioned in either said second contact position representing said scan mode or said third contact position representing said bypass mode, said chain circuit comprising an open circuit when any one of said plurality of three-position switches is positioned in said first contact position representing said select mode, whereby all said first inputs of said plurality of select gate means are activated when all said three-position switches are positioned in either said scan mode or said bypass mode and whereby said first inputs are inoperable when any one of said three-position switches is positioned in said select mode.

4. A radio broadcast receiver according to claim 3 in which said chain circuit comprises an electrical connection between said second and third contact positions of each of said plurality of three-position switches and the first pole of the adjacent three-position switch, whereby said first poles of said plurality of three-position switches are connected in a closed circuit through said second and third contact positions of said plurality of three-position switches.

5. A radio broadcast receiver according to claim 4 in which said chain circuit further comprises resistance means for biasing said first inputs of said select gate means when said chain circuit comprises a closed circuit.

6. A radio broadcast receiver according to claim 3 in which said second inputs of said plurality of select gate means each comprise a shunt input connectable through said first contact position to said second pole of said three-position switch representing said select mode, a gating input connectable through said second contact position to said second pole representing said scan mode and an open input connectable through said third contact position of said second pole representing said bypass mode, whereby one of the following three conditions exist in said select gate means: (1) said second input of said select gate means in rendered operable and said first input rendered inoperable when said three-position switch is positioned in said select mode; (2) said second input and said first input of said select gate means are rendered operable when said three-position switch is positioned in said scan mode; and (3) said first input of said select gate means is rendered operable and said second input rendered inoperable when said three-position switch is positioned in said bypass mode.

7. A radio broadcast receiver according to claim 6 in which each said select gate means comprises a transistor switch for actuating the particular tuning means associated with said select gate means in response to said scanning means, said transistor switch having its base connected to said first input and its emitter connected to said gating input of said second input, whereby said transistor switch actuates said particular tuning means when the three-position switch associated with said select gate means is positioned in said scan mode and said scanning means supplies a scan signal to said gating input;

a shunt means connected to said shunt input of said second input for bypassing said transistor switch and actuating said tuning means in response to a scan signal from said scanning means, whereby said shunt means enables said scanning means to actuate said particular tuning means when the associated three-position switch is positioned in said select mode; and an open circuit connected to said open input of said second input, whereby said select gate means disconnects said scanning means from said particular tuning means when the associated three-position switch is positioned in said bypass mode.

8. A radio receiver according to claim 1 further comprising a plurality of indicator means, one of which is associated with each preselected broadcast channel, for indicating the actuation of said preselected broadcast channel.

9. A radio receiver according to claim 1 further comprising reset means for resetting said scanning means in response to the positioning of one of said plurality of three-position switches in said select mode.

10. A radio receiver according to claim 1 further comprising scanning speed control means connected to said scanning means for adjusting the sequential scanning speed of said scanning means, said scanning speed control means responsive to the position of said plurality of three-position switches, whereby the scanning period of a particular preselected broadcast channel is effectively eliminated when the three-position switch associated with said particular channel is positioned in either the bypass mode or the scan mode at the same time a subgroup of one or more of the other three-position switches associated with other preselected broadcast channels is positioned in the select mode.

* * * * *

UNITED STATES PATENT AND TRADEMARK OFFICE
CERTIFICATE OF CORRECTION

PATENT NO. : 4,063,179
DATED : December 13, 1977
INVENTOR(S) : Marshall M. Brown It is certified that error appears in the above-identified patent and that said Letters Patent are hereby corrected as shown below:

Page 1, after "[73] Assignee: Craig Corporation," the following should appear -- Compton, California --

Signed and Sealed this

Tenth Day of April 1979

[SEAL]

Attest:

RUTH C. MASON
*Attesting Officer*

DONALD W. BANNER
*Commissioner of Patents and Trademarks*